United States Patent [19]

Palanisamy

[11] Patent Number: 4,939,022
[45] Date of Patent: Jul. 3, 1990

[54] ELECTRICAL CONDUCTORS

[75] Inventor: Ponnusamy Palanisamy, Kokomo, Ind.

[73] Assignee: Delco Electronics Corporation, Kokomo, Ind.

[21] Appl. No.: 328,991

[22] Filed: Mar. 27, 1989

Related U.S. Application Data

[62] Division of Ser. No. 177,285, Apr. 4, 1988, Pat. No. 4,847,003.

[51] Int. Cl.$^5$ .............................................. B32B 9/00
[52] U.S. Cl. .................................... 428/209; 428/210; 428/457; 428/461; 428/901
[58] Field of Search ............... 428/209, 210, 426, 457, 428/461, 901

[56] References Cited

U.S. PATENT DOCUMENTS

| | | | |
|---|---|---|---|
| 4,148,761 | 4/1979 | Kazmierowicz | 428/469 |
| 4,207,369 | 6/1980 | Kazmierowicz | 428/201 |
| 4,415,624 | 11/1983 | Prabhu et al. | 428/209 |
| 4,536,435 | 8/1985 | Utsumi et al. | 428/209 |
| 4,659,611 | 4/1987 | Iwase et al. | 428/698 |
| 4,776,978 | 10/1988 | Herron et al. | 252/512 |

Primary Examiner—Patrick Ryan
Attorney, Agent, or Firm—Robert J. Wallace

[57] ABSTRACT

In the fabrication of various hybrid devices, it is the practice to provide thick film conductors of two different compositions, namely, a high palladium content silver-palladium film and an essentially pure silver film. The silver-palladium films are used because of their excellent physical and chemical properties, but are relatively expensive. The silver-based films do not have comparably good properties (with the exception of low electrical resistivity), but are less expensive than the silver-palladium films and are used in substitution therefore on less "demanding" areas of the device. However, the two films interact when in contact, and discontinuities or open circuits can occur as a result. The present invention provides a novel silver-based conductor film including a small percentage of palladium and one or both of aluminum oxide and silicon dioxide. These additives function to inhibit interaction between the novel silver-based films and the known silver-palladium films, hence avoiding the occurrence of discontinuities, while still allowing low electrical resistance bonding between the two films.

6 Claims, 2 Drawing Sheets

ELECTRICAL CONDUCTORS

RELATED PATENT APPLICATION

This is a division of U.S. patent application Ser. No. 177,285 filed on Apr. 4, 1988, now U.S. Pat. No. 4,847,003.

FIELD OF THE INVENTION

This invention relates to electrical conductors, and particularly to thick film conductive films, primarily of silver, which are compatible for use with conductive films, primarily of silver and palladium, used, for example, in "hybrid devices".

BACKGROUND OF THE INVENTION

The term "hybrid devices" refers to (among other things) devices which include a ceramic substrate on which are mounted various components, e.g., semiconductor integrated circuits, capacitors, inductors, and the like. Electrical connections among the various components are by means of conductive films of material, generally in the form of narrow strips, which extend between the components along the surfaces of the substrate.

While not critical, the films have a thickness generally in the range of between 5 and 30 micrometers, and are referred to as "thick" films. In the fabrication of such films, they are generally first deposited, through a patterned screen, onto the workpiece in the form of an ink. The ink is dried and then fired to remove the various organic ink binders and to fuse together the particles of the film and adhere it to the ceramic substrate.

One extensively used thick film conductor comprises a sintered mixture of silver and palladium, the composition being, depending upon the particular device application, generally in the range of 65 to 85%, by weight, silver, balance palladium. Such silver-palladium (Ag-Pd) based films are quite stable, both physically and chemically, adhere well to various ceramics, and form excellent surfaces onto which various device components can be readily and reliably bonded, particularly by soldering. A problem with such Ag-Pd films, however, is that owing to the relatively high content of palladium thereof, they are rather expensive and possess high electrical resistivity.

For purposes of cost savings, it is often the practice to use such Ag-Pd films only on "critical" areas of the substrate, e.g., where components are to be soldered, and to use less expensive silver based conductive films as extensions of the Ag-Pd films. Such pure silver films cannot fully replace the Ag-Pd films because they are not adequately stable. For example, the essentially pure silver films tend to migrate along the surface of the substrate (particularly in humid environments), hence cannot be used where extremely close spacings between films are required, and the silver films are easily leached away by commonly used solders thus leading to unreliable joints.

A further problem with the use of pure silver films is that they tend to form alloys with the Ag-Pd films where joints between the two are required. During such alloying, silver from one of the films (as described hereinafter) migrates into the other film with the possible result that one of the films becomes so thin that a discontinuity or break occurs between the two films where they first make contact. Heretofore, this undesirable result has been generally avoided by insuring that there is an adequate thickness of both films where they contact one another. Thus, even with the occurrence of the alloying and migration of silver between the films, each film remains integral and without discontinuities therein.

A growing problem, however, is that the trend is to make hybrid devices ever smaller and of greater component density. This greatly reduces the flexibility of design of the conductive paths, and conditions often arise (described hereinafter) where it is extremely difficult to provide an adequate thickness of the two films where they contact one another. Thus, discontinuities often develop. While it is possible, of course, to make greater use of the Ag-Pd films, this is undesirable due to high cost and high electrical resistivity. Accordingly, a need exists for improved silver based conductors which are significantly less expensive than the Ag-Pd conductors, but which possess low electrical resistivity and form reliable joints or connections therewith even under adverse, reduced film thickness conditions.

SUMMARY OF THE INVENTION

The aforestated need is satisfied, in accordance with this invention, by the use of electrically conductive film compositions which are primarily silver (between 60 to 90% by weight), and which contain additives which inhibit interaction between the inventive films and Ag-Pd based films of the aforedescribed type. The additives are palladium (between 0.5–5%) and one or both of aluminum oxide (0–25%) and silicon dioxide (0–15%). The compositions are formulated with each of the ingredients in powder form, and, preferably, the silver particles are significantly larger than the additive particles. As described hereinafter, during and after firing, the additive particles surround the silver particles and serve as a barrier against interaction between the silver based and silver-palladium based films. The presence of such barriers significantly reduces the occurrence of discontinuities, while, however, not preventing the formation of low electrical resistance joints within the silver film and between the two films.

Other aspects of the invention, including the formulation and application of the inventive conductive films to workpieces, are described hereinafter.

The invention will be better understood from the following more detailed description taken in connection with the accompanying drawings.

DESCRIPTION OF THE DRAWINGS

FIGS. 1 and 2 show the device in successive stages of fabrication; and FIG. 3 shows a defect of the type encountered in the past.

DETAILED DESCRIPTION OF THE INVENTION

As previously described, the present invention relates to silver based film conductors which are particularly well suited for use with silver-palladium based conductors, particularly in situations where the thickness of the films tends to be somewhat reduced from normal. In such situations, as described, the likelihood of the occurrence of film discontinuities is greatly increased.

Figure 1:
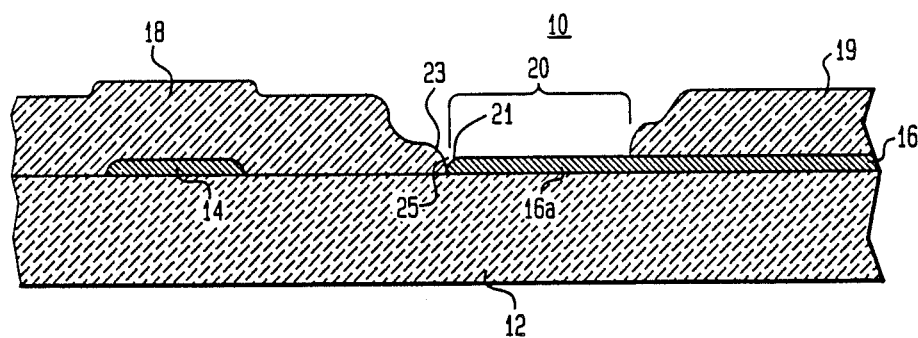
FIGS. 1, 2 and 3 show, in cross section, a portion of a hybrid device.
Figure 2:
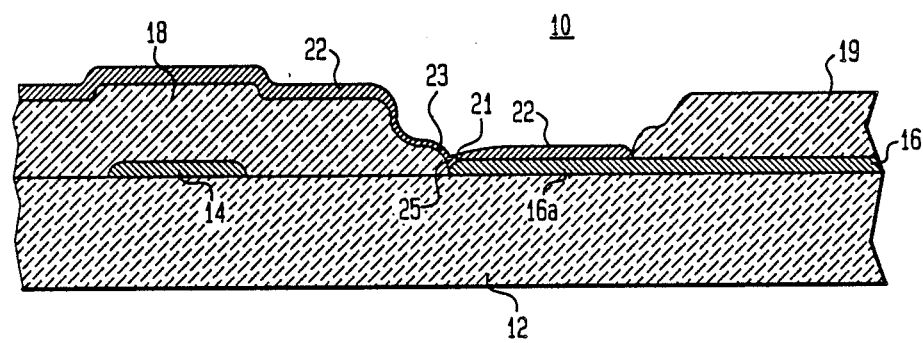
Figure 3:
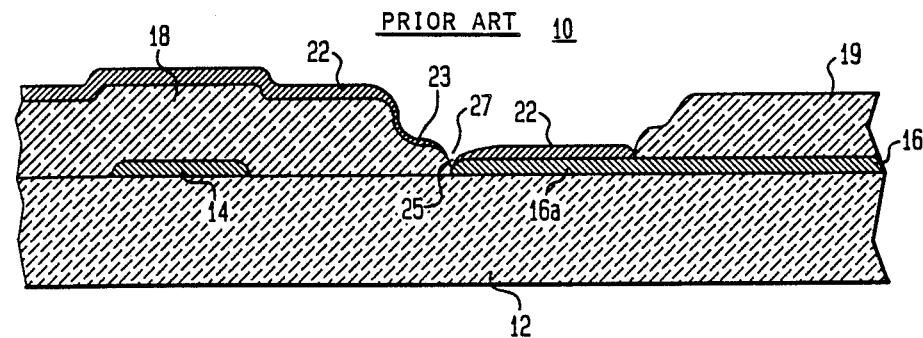

One example of such a situation is illustrated in FIGS. 1 through 3. In FIG. 1, a portion of a known type of hybrid device 10 is shown which includes a substrate 12, generally of a high alumina (e.g., 96% by weight) ceramic, and two separate and spaced apart thick film conductor strips 14 and 16 extending along a surface of the substrate. The two strips 14 and 16 extend in orthogonal directions; the strip 14 extending in a direction perpendicular to the plane of the drawing, and the strip 16 extending left to right within the drawing plane. Both strips are of the same material, namely, a known silver-palladium material of high palladium content, e.g., Ag:Pd=1.85:1, by weight. Each of the strips 14 and 16 is coated with a thick film 18 and 19, respectively, of a dielectric material, e.g, a known type of glass ceramic. A portion 16a of the film 16 is left uncovered by the film 19 to provide electrical access to the film 16 (see FIG. 2, described hereinafter).

The conductive strips 14 and 16 have a thickness of around 10 micrometers, and the dielectric films 18 and 19 have a thickness of around 45 micrometers. These dimensions are not critical, and vary from device to device, but, in general, the dielectric films 18 and 19 are generally several times thicker than the films 14 and 16. One result of this difference in thickness is that a relatively deep cavity 20 (see FIG. 1) is created between the two dielectric films 18 and 19 where the film portion 16a is exposed. Additionally, because of the slopes of edges 21 and 23 of the conductive film 16 and the dielectric layer 18, respectively, there is present a V-shaped trough 25 between two layers 16 and 18. The significance of the relatively deep cavity 20 and the V-shaped trough 25 is described shortly hereinafter.

To the point so far described, the device 10 is well known, using known materials and known fabrication techniques. Also, at this stage of processing, the conductive films 14 and 16 have been fired and are firmly sintered in place.

The purpose of the dielectric layer 18 is to allow a crossing of the conductive path 16 over the conductive strip 14 without electrical contact therebetween. This is illustrated in FIG. 2, which shows the presence of an additional thick film conductor 22 which overlaps and is electrically connected to the strip portion 16a. The strip 22 is primarily of silver (i.e., the aforementioned prior known silver based composition) and is used as an extension of the strip 16 for purposes of cost savings and low electrical resistivity. As shown, the strip 22 extends from its area of contact with the strip 16 into and across the V-shaped trough 25 and then climbs over and across the dielectric layer 18.

As previously noted, the situation shown in FIG. 2 is one in which discontinuities often occur. The causes of this are as follows.

One cause is that, owing to the presence of the relatively large obstacle over which the strip 22 must cross (i.e., the dielectric layer 18), the thickness of the layer 22 tends to be reduced from normal thickness along the vertical sides 23 of the layer 18. This follows from the screen printing process used in which the amount of ink deposited on a given surface portion of the workpiece is a function solely of the horizontal dimensions of the pattern being printed. Thus, where a printed pattern must also climb over an object, thereby increasing its path length, the thickness of the printed film along the vertical portion of travel of the path is automatically reduced. The effect of such reduction in film thickness is discussed hereinafter.

Other causes for discontinuities in the FIG. 2 situation are the presence of the deep cavity 20 (see FIG. 1) and the V-notch 25. Both these features, as known, tend to interfere with a uniform thickness deposition of the covering layer 22, with the frequent result that the film 22 is of reduced thickness where it crosses the bottom of the cavity 20 (and over the film portion 16a) and particularly where it crosses the trough 25.

Thick film 18 can either be separated from conductive strip 16a or can overlap it. A relatively sharp corner is formed when thick film 18 overlaps conductive strip 16a. A discontinuity can occur when a conductor is formed which drops along the vertical edge of thick film 18 and passes over this corner.

FIG. 3 shows the result often arising from the reduced thickness portions of the strip 22: namely a break or discontinuity 27 in the strip 22, generally directly overlying the trough 25. Such discontinuity arises from the fact that, during the application of the film 22 to the device, which involves a firing of the workpiece to sinter the film 22 and adhere it to the workpiece, an alloying occurs between the two films 16 and 22. Such alloying tends to remove silver from the film then being fired, in this case, the film 22, and, owing to the reduced thickness portions of the film 22, a complete severing of the film 22 often occurs. This breaks the electrical connection between the films 16 and 22 resulting in a defective device.

In some instances, the severing of the film 22 does not occur during fabrication of the device, but, occurs some time after the device has been put into operation where the already fragile connection experiences wide thermal excursions. This, of course, presents even a more severe problem.

Figure 4:
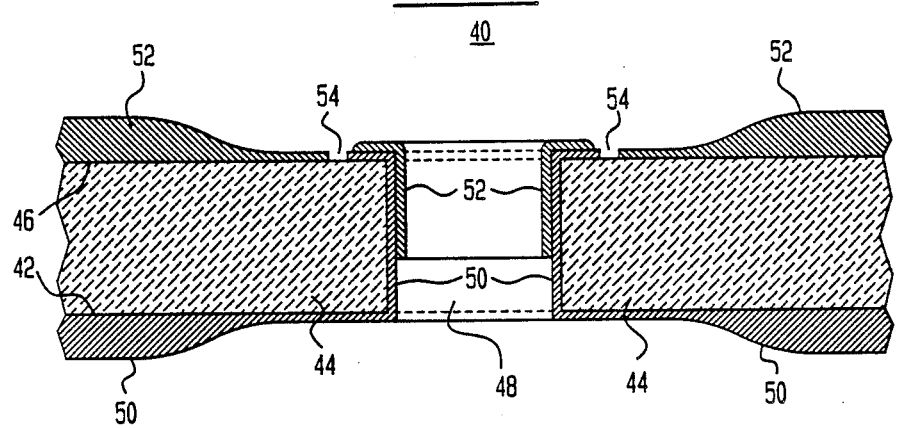
FIG. 4 shows, in cross section, another portion of a hybrid device, such portion including a coated hole therethrough, and also showing a defect of the type encountered in the past.

FIG. 4 shows a further example of a portion of a hybrid device 40 where film discontinuities often occurred. In this example, an ink containing a silver-based composition according to the prior art is first applied to the bottom surface 42 of the ceramic substrate 44 and then, while the ink is still fluid, a vacuum is applied to the upper surface 46 of the substrate to draw a portion of the ink through a hole 48 entirely through the substrate. The ink thus coats the wall of the hole 48 and spreads slightly along that portion of the substrate upper surface 46 immediately surrounding the hole. The ink is then dried and fired to produce the silver-based conductive film 50 shown.

In the vacuum drawing process, the source of the ink which is drawn through the hole 48 is only that ink which is present immediately adjacent to the hole at the substrate bottom surface 42. Thus, while no difficulty is generally encountered obtaining a continuous film 50 along the hole wall, the thickness of the film 50 within the hole, along the upper substrate surface 46, and along the substrate bottom surface 42 immediately surrounding the hole (from whence the ink was drawn through the hole) tends to be thinner than normal.

Thereafter, the process is repeated to provide a film 52 of the prior known silver-palladium composition, such film 52 also extending into the hole to overlap the film 50 and form an electrical interconnection therewith. As with the film 50, however, the thickness of the film 52 immediately adjacent to and within the hole 48 is thinner than normal. Film 50 is drawn all the way to and including a portion of the top surface only to ensure good overlap between film 50 and film 52. It is possible to draw the films only partway into the hole and establish contact. However, that process causes the discontinuity mentioned earlier to occur inside the hole.

In such situations, a discontinuity 54 often develops through the film 52 where it first overlaps the edge of the film 50. In this instance, the discontinuity develops in the silver-palladium film rather than, as in the situation illustrated in FIG. 3, in the silver-based film. In general, the discontinuities, whether occurring during firing or thereafter during the life of the device, appear in the second of the two films applied to the workpiece. The firing of the first applied film tends to stabilize it, and most of the material which migrates between the films, thus causing a film discontinuity, comes from the second film while the particles thereof are still relatively mobile during the firing process for the second applied film.

In accordance with this invention, the aforedescribed problem of the formation of discontinuities at the junctions between silver-based and silver-palladium based conductive films is solved by the use of new silver-based films which contain at least two different additives. The function of the additives, as hereinafter described, is to inhibit interaction between the silver-based and silver-palladium based films while, at the same time, allowing the formation of a high electrical conducting and strong mechanical bond between the two films.

Table 1 lists the components and the ranges of percentages, by weight, of the various components present in the conductive film compositions according to this invention. The main component of each composition is silver. Under the heading "Inhibitors" is a list of three additives which inhibit interaction between the Ag based and Ag-Pd based films, namely, palladium, in the range between 0.5% and 5%, and one or both of aluminum oxide (0–25%) and silicon dioxide (0–15%). One of the inhibitor additives is thus always palladium, and, while not expressed in Table 1, at least one of the aluminum oxide and silicon dioxide additives is also present.

TABLE 1

| Component | Fired Film Composition (By Weight Percentage) | Particle Size (micrometers) Range | Average |
|---|---|---|---|
| Silver | 60–90 | 0.5–15.0 | 5.0 |
| Inhibitors | | | |
| Palladium | 0.5–5 | 0.1–5.0 | 0.5 |
| Aluminum Oxide | 0–25 | 0.2–3.0 | 1.0 |
| Silicon Dioxide | 0–15 | 0.2–3.0 | 1.0 |

TABLE 1-continued

| Component | Fired Film Composition (By Weight Percentage) | Particle Size (micrometers) Range | Average |
|---|---|---|---|
| Adhesives | | | |
| Bismuth Trioxide | 0–5 | 1.0–5.0 | 2.0 |
| Copper Oxide | 0–2 | 1.0–5.0 | 2.0 |
| Glass Frit containing oxides of Pb, B, Si & Al | 0–15 | 1.0–5.0 | 2.0 |

The various components of the composition are preferably provided in powder form, and Table 1 also lists particle size data (range and average size) for one powder sample for each component. While the particular sizes are not critical, what does appear significant, however, is that the average size of the silver particles be significantly larger than the average size of the inhibitor particles. Thus, preferably, in any given film composition (such as those listed in Table 2) the various silver and inhibitor particles are selected to provide this desired size relationship, i.e., average size silver particles preferably 4–5 times larger than the average size inhibitor particles.

In accordance with existing theories of sintering, what is believed to occur in the deposited films, particularly during firing thereof, is that the smaller palladium particles surround the larger silver particles and chemically react (i.e., form an alloy) with surface portions of the silver particles. Such surface alloying, it is believed, provides a barrier which "discourages" and prevents migration of silver in either direction between the novel silver-based films and the known silver-palladium based films. The avoidance of such migration preserves each film independent of the other and, even in situations where the films are quite thin, discontinuities do not develop.

The other two inhibitors, aluminum oxide and/or silicon dioxide, do not chemically react with the silver particles, but merely surround them and serve as physico-chemical barriers against movement or migration of the silver particles.

Table 2 lists specific examples of individual film compositions according to the present invention and also provides the sheet resistance of each.

TABLE 2

| | (By Weight Percentage) | | | | | | | Sheet Resist. milliohm/ square |
|---|---|---|---|---|---|---|---|---|
| No. | Ag | Pd | Al$_2$O$_3$ | SiO$_2$ (Amorphous) | Bi$_2$O$_3$ | CuO | Glass Frit | |
| 1 | 74 | 5 | 8.6 | 1.4 | 0 | 0 | 11 | 13.5 |
| 2 | 83 | 2 | 8.6 | 1.4 | 0 | 0 | 5 | 5.6 |
| 3 | 84 | 3 | 0 | 10 | 0 | 0 | 3 | 7.2 |
| 4 | 82 | 3 | 12 | 0 | 0 | 0 | 3 | 7.0 |
| 5 | 82 | 3 | 12 | 0 | 2 | 1 | 0 | 8.3 |
| 6 | 83 | 2 | 12 | 0 | 2 | 1 | 0 | 7.3 |
| 7 | 84 | 1 | 12 | 0 | 2 | 1 | 0 | 5.7 |
| 8 | 87.5 | 1.5 | 8 | 0 | 2 | 1 | 0 | 3.4 |
| 9 | 85 | 2 | 10 | 0 | 2 | 1 | 0 | 4.5 |
| 10 | 90 | 1 | 6 | 0 | 2 | 1 | 0 | 2.5 |
| 11 | 72 | 0.5 | 10.5 | 2 | 0 | 0 | 15 | 32.0 |
| 12 | 84.5 | 1.5 | 8 | 0 | 2 | 1 | 3 | 3.8 |
| 13 | 81.5 | 1.5 | 8 | 0 | 6 | 3 | 0 | 4.4 |
| 14 | 71 | 1 | 25 | 0 | 2 | 1 | 0 | 35.0 |

While it may not be evident from Table 2, owing to the varying amounts of the other ingredients of each composition, it is found that the sheet resistance of the compositions increases with increasing proportions of the aluminum oxide and silicon dioxide additives. The reason these electrically non-conductive additives are used is because, in their absence, excessive quantities of palladium would have to be used to provide the desired film interalloying inhibition. This would undesirably increase the cost and resistivity of the films. In this invention, even with substantial additions of the aluminum oxide and silicon dioxide additives, in the prescribed proportions, adequately low sheet resistances are obtained.

Tables 1 and 2 list other ingredients identified as "adhesives" in Table 1. The use of such adhesives, and the functions thereof, are generally known. Briefly, during firing of the films, these materials melt (with the exception of the copper oxide, as further discussed hereinafter) and form a low viscosity liquid which serves, in a phenomenon known as "liquid assisted sintering," to force the various particles into a close touching relationship. By forcing the silver particles into contact with one another, low electrical resistance conductive films are produced. It is also likely that the desired surrounding relationship of the inhibitor particles around the silver particles is also promoted by this phenomenon. Finally, the adhesive additives provide a fused matrix for binding the various other particles together in a continuous film and for firmly adhering the film to the ceramic substrate and to any other underlying surfaces, e.g., dielectric films (e.g., the film 18 shown in FIG. 2) and the silver-palladium based films.

As noted, the adhesive copper oxide does not melt during the firing process. Its presence, which is not critical to this invention, is found, however, to improve the adhesion of the inventive films to the ceramic substrate, particularly under conditions of frequent temperature variations during use of the hybrid devices.

Other known adhesives, such as lead silicate can be used. Also, various known glass frits can be used in place of the specific ones listed in Table 1, see for example, R. W. Vest, "Thick Film Glasses", Final Technical Report for the period 6/1/77 to 8/31/78, prepared for the Naval Research Laboratory under Contract No. N00173-77-C-0142, Purdue University, Nov. 15, 1978.

At the present time, the preferred composition is No. 8 of Table 2, one reason being the low resistivity of this composition. Composition No. 10 of Table 2 has a lower resistivity but a larger amount of silver.

The various components of the conductor compositions are generally commercially available. For example, the silver powders (preferably of the "high density" type) and the palladium powder ("palladium black") are available from Metz Metallurgical Corporation, and the glass frits are available from Delco Electronics Corporation. The remaining components are reagent grade materials widely available and are ball milled to the desired particle sizes.

The fabrication of the various novel film compositions, the application of the film compositions to hybrid devices, and the fusing of the films are all done using generally known processes. Thus, for example, the various components of any one of the various compositions listed in Table 2 are added to a known screening agent (or thick-film vehicle) composition to formulate an ink suitable for use in a known screening deposition process. One such screening agent composition comprises a combination of diethylene glycol monobutyl ether (between 88 and 95%, by weight) of the screening agent composition (note that this material is an organic solvent similar to terpeneol) ethyl cellulose N-200 (between 3 and 7%) and "Igepal" CO-430 (between 2 and 5%), the term "Igepal" being the trade name for a wetting agent (an ethoxylated alkyl phenol-made by the GAF Corporation).

In the preparation of the screening agent, the ethyl cellulose is first dissolved in the ether and Igepal. Then the particular conductor composition (Table 2) being prepared for deposition is combined with the screening agent to formulate the screening ink. While not critical, the screening agent can comprise between 10–25% by weight of the ink.

The ink ingredients are preferably thoroughly mixed together using, for example, a known 3-roll mill blender.

Having prepared the desired ink for the particular composition being formed, the ink is then preferably applied to the workpiece in the desired pattern, using a known screening process. Other deposition processes, such as spraying through a mask, can be used. Then, to adhere the deposited ink to the workpiece, the workpiece is heated at a temperature of about 125 degrees C. for about 10 minutes. The ether is baked out during this step. Finally, to remove the remainder of the screening agent and to fuse together the various ingredients of the conductive film composition, the workpiece is air fired typically at a temperature of about 850 degrees C. for about 10 minutes.

The embodiments of the invention in which an exclusive property or privilege is claimed are defined as follows:

1. A combination of a workpiece and a first thick film conductor thereon, said conductor comprising a composition comprising, by weight, silver (60–90%), palladium (0.5–5%), and one or both of aluminum oxide (0–25%) and silicon dioxide (0–15%), the ingredients of said composition being fused together and fused to said workpiece.

2. The combination of claim 1 including a second thick film conductor comprising a composition including silver and palladium, the ratio of palladium to silver, by weight, being at least 0.25, said first and second films engaging one another in a low electrical resistance contact.

3. A combination of a workpiece and a first thick film conductor thereon, said conductor comprising a composition comprising, by weight, silver (60–90%), palladium (0.5–5%) and one or both of aluminum oxide (0–25%) and silicon dioxide (0–15%), the ingredients of the composition being present in powder form, the average size particles of silver being at least 4 to 5 times larger than the average size particles of the others of said ingredients, individual particles of said palladium surrounding and forming an alloy with surface portions of individual ones of said silver particles, and individual silver particles being surrounded by individual particles of said aluminum oxide and/or said silicon dioxide particles.

4. The combination of claim 3 including a second thick film conductor comprising a composition including silver and palladium, the ratio of palladium to silver, by weight, being at least 0.25, said first and second films engaging one another in a low electrical resistance contact.

5. A combination of a workpiece and a first thick film conductor thereon, said conductor comprising a composition comprising, by weight, silver (60–90%), palladium (0.5–5%), and one or both of aluminum oxide (0-25%) and silicon dioxide (0-15%), the ingredients of said composition being fused together and fused to said workpiece, and the composition including at least one adhesion additive for the purpose of, after the firing of said composition in a process of applying said composition onto a workpiece, fusing together the particles of said composition and adhering it to said workpiece.

6. The combination of claim 5 including a second thick film conductor comprising a composition including silver and palladium, the ratio of palladium to silver, by weight, being at least 0.25, said first and second films engaging one another in a low electrical resistance contact.

* * * * *